(12) United States Patent
Kondo

(10) Patent No.: US 9,823,438 B2
(45) Date of Patent: Nov. 21, 2017

(54) ELECTRO-OPTICAL DEVICE, MANUFACTURING METHOD OF ELECTRO-OPTICAL DEVICE, AND ELECTRONIC APPARATUS

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 15/385,106

(22) Filed: Dec. 20, 2016

(65) Prior Publication Data

US 2017/0102516 A1    Apr. 13, 2017

Related U.S. Application Data

(62) Division of application No. 15/017,964, filed on Feb. 8, 2016, now Pat. No. 9,541,729.

(30) Foreign Application Priority Data

Mar. 26, 2015   (JP) .................. 2015-063930

(51) Int. Cl.
*G02B 26/08* (2006.01)
*G02B 7/18* (2006.01)
(Continued)

(52) U.S. Cl.
CPC ............ *G02B 7/1815* (2013.01); *B81B 7/008* (2013.01); *B81C 1/00317* (2013.01); *G02B 5/208* (2013.01); *G02B 26/0841* (2013.01); *G03B 21/008* (2013.01); *B81B 2201/042* (2013.01); *B81B 2207/012* (2013.01);
(Continued)

(58) Field of Classification Search
CPC .. G02B 26/0841; G02B 6/43; G02B 27/0025; G02B 26/085; G02B 27/0031; G02B 27/01; G02B 27/017; G02B 27/1066; G02B 5/26; G02B 5/28; G02B 5/281; G02B 7/1815; G02B 5/208; B81C 2203/0118; B81C 1/00317; B81C 203/0785; H01H 59/0009; H01L 2924/10155; H01L 2224/48091; H01L 2224/73265; H01L 2924/00014; B81B 7/008;
(Continued)

(56) References Cited

U.S. PATENT DOCUMENTS 6,809,866 B2   10/2004  Xie et al.
7,898,724 B2    3/2011  Liu et al.
2014/0292421 A1  10/2014  Kondo

FOREIGN PATENT DOCUMENTS

JP   2008-009217 A   1/2008
JP   2011-222613 A   11/2011
JP   2014-197738 A   10/2014

OTHER PUBLICATIONS

Jun. 16, 2016 Office Action issued in U.S. Appl. No. 15/017,964.
Sep. 19, 2016 Notice of Allowance issued in U.S. Appl. No. 15/017,964.

*Primary Examiner* — James Phan
(74) *Attorney, Agent, or Firm* — Oliff PLC

(57) ABSTRACT

An electro-optical apparatus has an element substrate that is provided with a mirror and a sealing member which seals the mirror, and the sealing member includes a light-transmitting cover which faces the mirror opposite from the element substrate. An infrared cut filter is laminated on the light-transmitting cover.

2 Claims, 10 Drawing Sheets

(51) Int. Cl.
  *G02B 5/20* (2006.01)
  *B81C 1/00* (2006.01)
  *B81B 7/00* (2006.01)
  *G03B 21/00* (2006.01)

(52) U.S. Cl.
  CPC .......... *B81C 2203/0118* (2013.01); *B81C 2203/0785* (2013.01); *H01L 2224/48227* (2013.01); *H01L 2224/73265* (2013.01); *H01L 2924/15174* (2013.01); *H01L 2924/16195* (2013.01)

(58) Field of Classification Search
  CPC ... B81B 2207/012; B81B 2203/011888; B81B 2201/042; G03B 21/008; G03B 2201/042
  USPC .... 359/350–361, 199.1, 199.4, 200.6–200.8, 359/212.1–215.1, 223.1–226.2
  See application file for complete search history.

ELECTRO-OPTICAL DEVICE, MANUFACTURING METHOD OF ELECTRO-OPTICAL DEVICE, AND ELECTRONIC APPARATUS

This Application is a Division from U.S. patent application Ser. No. 15/017,964, filed Feb. 8, 2016, which claims priority to Japanese Patent Application No. 2015-063930, filed Mar. 26, 2015. The entire disclosures of both applications are expressly incorporated by reference herein.

BACKGROUND

1. Technical Field

The present invention relates to an electro-optical device which is provided with a mirror, a manufacturing method of the electro-optical device, and an electronic apparatus.

2. Related Art

As an electronic apparatus, for example, a projection-type display apparatus or the like is known which displays an image on a screen by enlarging and projecting modulated light using a projection optical system after light which is emitted from a light source is modulated by a plurality of mirrors (micro mirrors) of an electro-optical device referred to as a digital mirror device (DMD). As shown in FIG. 11, the electro-optical device which is used in the projection-type display apparatus and the like is provided with an element substrate 1 which is provided with a mirror 50 on one face 1s side, a spacer 61 which is adhered on the one face 1s side of the element substrate 1 so as to surround the mirror 50 in planar view, and a plate-like light-transmitting cover 71 which is supported on an end section opposite from the element substrate 1 of the spacer 61. In addition, for example, the electro-optical device has a sealing substrate 90 on which a concave shaped substrate mounting section 93 is formed and which is surrounded by a side plate section 92, and the element substrate 1 is fixed on a bottom side of the substrate mounting section 93 using an adhesive 97, then is sealed using a sealing resin 98 which is filled into the substrate mounting section 93.

In the electro-optical device which is configured in this manner, light passes through a light-transmitting cover 71 and is incident on the mirror 50, and the light which is reflected by the mirror 50 passes through the light-transmitting cover 71 and is emitted. At that time, a temperature of the element substrate 1 or the like may increase caused by the light which is irradiated on the one face 1a of the element substrate 1. The increase in temperature is not preferable due to causing malfunctions and reduction in life of the electro-optical device.

Meanwhile, a technique in which a contact area between a device and a sealing resin is widened is proposed as a method for increasing heat dissipation of a device in which the sealing substrate 90 is mounted (refer to U.S. Pat. No. 7,898,724 B2). For example, as shown in FIG. 11, a front face of the sealing resin 98 is configured to come into contact with the light-transmitting cover 71 at a position which is higher than the side plate section 92 of the sealing substrate 90. According to the configuration, it is possible to increase transmission efficiency of heat from the light-transmitting cover 71 to the sealing resin 98.

However, using the configuration which is illustrated in FIG. 11, there is a problem in that it is not possible to sufficiently suppress temperature increase of the element substrate 1 since the heat transmission efficiency of the sealing resin 98 itself is reduced even though the transmission efficiency of heat from the light-transmitting cover 71 to the sealing resin 98 is increased.

SUMMARY

An advantage of some aspects of the invention is to provide an electro-optical device which is able to prevent a temperature increase of the element substrate on which a mirror is provided, a manufacturing method of the electro-optical device, and an electronic apparatus.

An electro-optical device according to an aspect of the invention includes an element substrate, a mirror that is provided on a first face side of the element substrate, a driving element that drives the mirror, a sealing member that has a light-transmitting cover and is provided such that the mirror is positioned between the light-transmitting cover and the element substrate, and an infrared cut filter that is provided on the light-transmitting cover.

In the electro-optical device according to the aspect of the invention, light passes through the light-transmitting cover and is incident on the mirror, and the light which is reflected by the mirror passes through the light-transmitting cover and is emitted. At that time, it is possible to suppress an increase in temperature of the element substrate and the like which is caused by light that passes through the light-transmitting cover and light that is irradiated onto the element substrate since the infrared cut filter is provided on the light-transmitting cover. Accordingly, it is possible to suppress malfunctions and a reduction in life of the electro-optical device which is caused by an increase in temperature of the element substrate and the like.

In the aspect of the invention, it is preferable that the infrared cut filter is formed of a film which is laminated on at least one of a second face of the light-transmitting cover and a third face of the light-transmitting cover, the second face faces the mirror, and the third face is on an opposite side from the second face.

In the aspect of the invention, it is preferable that a substrate on which the element substrate is mounted is included, a lead terminal extends outside from the substrate, and the lead terminal has a bent section that is bent in a direction in which a leading end section of the lead terminal is away from the substrate. According to this configuration, there is a space between the substrate and a circuit board when the electro-optical device is mounted on a circuit board or the like via the lead terminal. Accordingly, it is possible to increase heat dissipation from the electro-optical device by passing a fluid body such as air between the substrate and the circuit board. Therefore, it is possible to suppress malfunctions and a reduction in life of the electro-optical device which are caused by an increase in temperature of the element substrate and the like.

In the aspect of the invention, it is preferable that the lead terminal includes a convex section that protrudes in a direction which intersects with an extension direction of the lead terminal. According to this configuration, it is possible to increase heat dissipation from the lead terminal. Therefore, it is possible to suppress malfunctions and a reduction in life of the electro-optical device which are caused by an increase in temperature of the element substrate and the like.

In the aspect of the invention, it is preferable that a heat dissipation unit is provided on a face on an opposite side from the element substrate of the substrate. According to this configuration, it is possible to increase heat dissipation from the substrate. Therefore, it is possible to suppress malfunctions and a reduction in life of the electro-optical device which are caused by an increase in temperature of the element substrate and the like.

In the aspect of the invention, for example, the heat dissipation unit is a heat sink on which a heat dissipation fin is provided. In addition, a pettier element may be used as the heat dissipation unit.

The aspect of the invention may adopt a configuration in which the sealing member includes a spacer that surrounds a region in which the mirror is formed between the element substrate and the light-transmitting cover, the element substrate is accommodated inside a concave shaped substrate mounting section which is formed on the substrate, and the sealing resin that seals around the spacer is provided inside the substrate mounting section.

A manufacturing method of the electro-optical device according to another aspect of the invention includes preparing a first wafer that is provided with a mirror, a driving element that drives the mirror, and a terminal, forming a second wafer on which a bottom section of a concave section with translucence and an infrared cut filter that overlaps with the concave section are provided, adhering a face on a side on which the mirror of the first wafer is provided such that the mirror and the concave section overlap in planar view and a face on which the concave section of the second wafer is provided, and splitting the first wafer and the second wafer.

In this case, in the forming of the second wafer, it is possible to adopt an aspect in which forming of the infrared cut filter on a light-transmitting wafer, forming of a through hole in a spacer wafer, and obtaining the second wafer by adhering the light-transmitting wafer with the spacer wafer so as to overlap each other are performed.

The electro-optical device according to the aspect of the invention may adopt a form in which the element substrate is accommodated inside the concave shaped substrate mounting section which is formed on the substrate, and an opening end of the substrate mounting section is closed using the light-transmitting cover which is fixed on the substrate. According to this configuration, it is possible to simplify the structure of the electro-optical device.

In this case, it is preferable that the light-transmitting cover is fixed using sealing glass on the substrate. According to this configuration, it is possible to improve reliability of a sealing portion of the light-transmitting cover and the substrate.

The electro-optical device to which the invention is applied is able to be used in various electronic apparatuses, in this case, a light source section which irradiates light from a light source onto the mirror is provided in the electronic apparatus. In addition, in a case where a projection-type display apparatus is configured as the electronic apparatus, a projection optical system which projects light which is modulated using the electro-optical device is further provided in the electronic apparatus.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
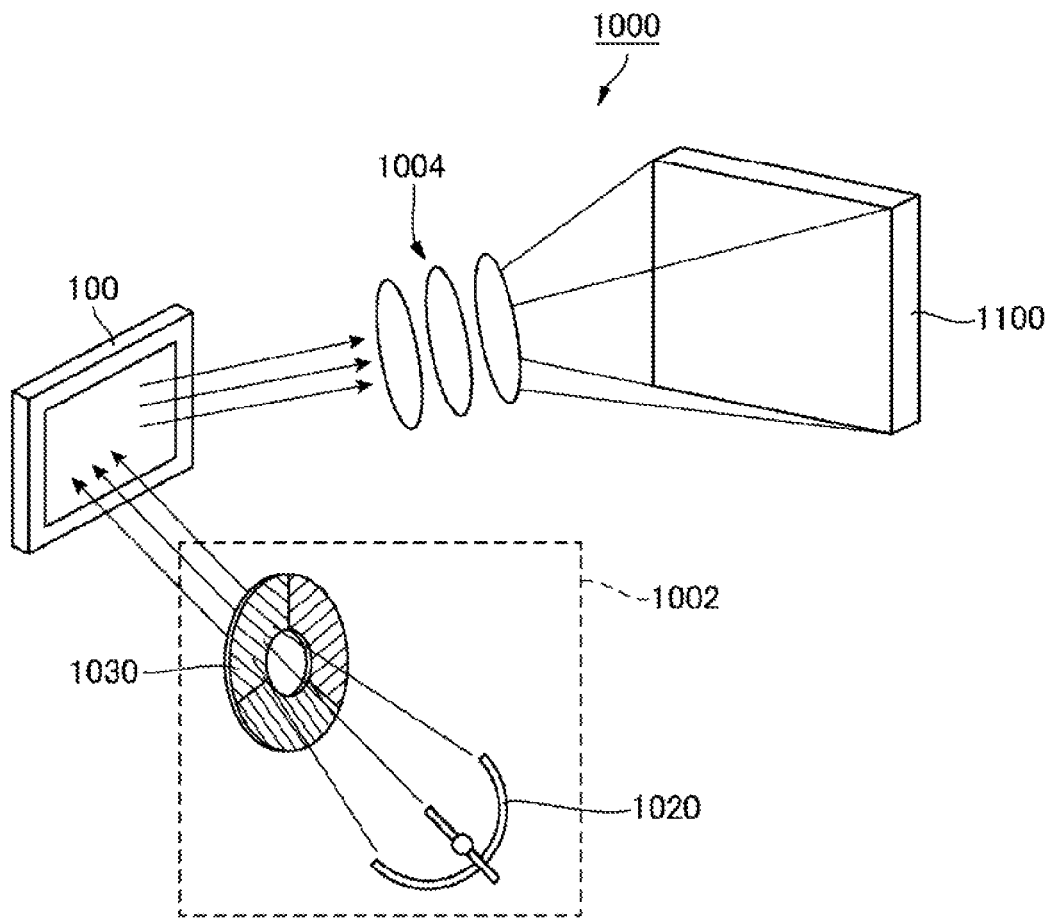
FIG. 1 is a schematic view illustrating an optical system of a projection-type display apparatus as an electronic apparatus to which the invention is applied.

Embodiments of the invention will be described with reference to the drawings. Here, a projection-type display apparatus will be described below as an electronic apparatus to which the invention is applied. In addition, in the drawings described below, the scale of each layer and each member is different in order for the sizes of each layer and each member to be to the extent so as to be recognizable in the drawings. In addition, the number of mirrors or the like which are illustrated in the drawings are set to be size to the extent so as to be recognizable in the drawings, but a larger number of mirrors or the like than illustrated in the drawings may be provided. Here, in the embodiments below, for example, a case where "disposed on a first face side" is described, a case of disposing so as to come into contact with the first face, a case of disposing on the first face via another construction, or a case of disposing a portion so as to come into contact with the first face and disposing a portion via another construction may be included.

Embodiment 1

Projection-Type Display Apparatus as Electronic Apparatus

FIG. 1 is a schematic view illustrating an optical system of a projection-type display apparatus as an electronic apparatus to which the invention is applied. A projection-type display apparatus 1000 which is illustrated in FIG. 1 has a light source section 1002, an electro-optical device 100 which modulates light which is irradiated from the light source section 1002 according to image information, and a projection optical system 1004 which projects the light which is modulated by the electro-optical device 100 as a projection image onto a projection target 1100 such as a screen. The light source section 1002 is provided with a light source 1020 and a color filter 1030. The light source 1020 emits white light, the color filter 1030 emits light of each color accompanying rotation, the electro-optical device 100 modulates incident light at a timing synchronized with the rotation of the color filter 1030. Here, a fluorescent substrate which converts the light emitted from the light source 1020 to light of each color may be used in place of the color filter 1030. In addition, the light source section 1002 and the electro-optical device 100 may be provided in each light of each color.

Basic Configuration of Electro-Optical Device 100

Figure 2A:
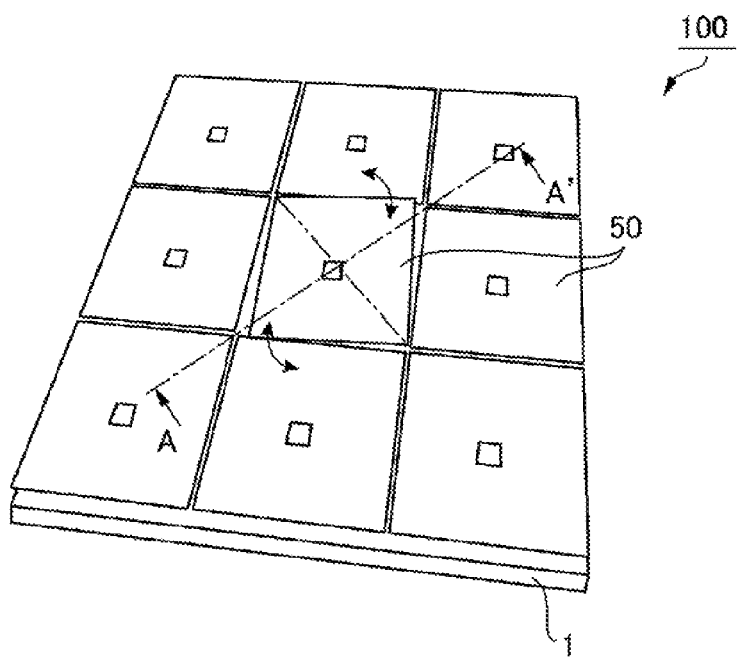
FIGS. 2A and 2B are schematic views schematically illustrating a basic configuration of an electro-optical device to which the invention is applied.
Figure 2B:
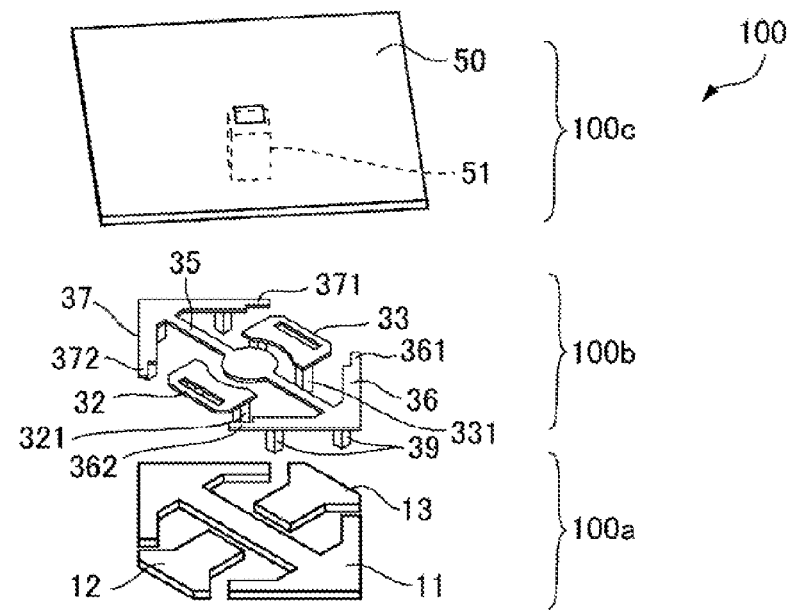
Figure 2B:
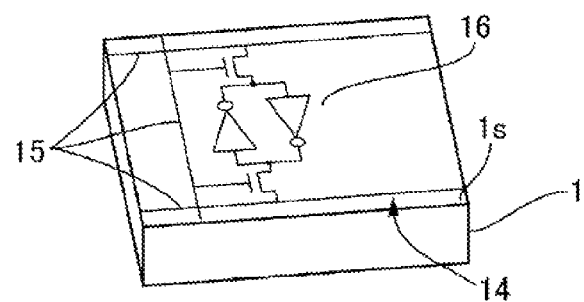
Figure 3A:
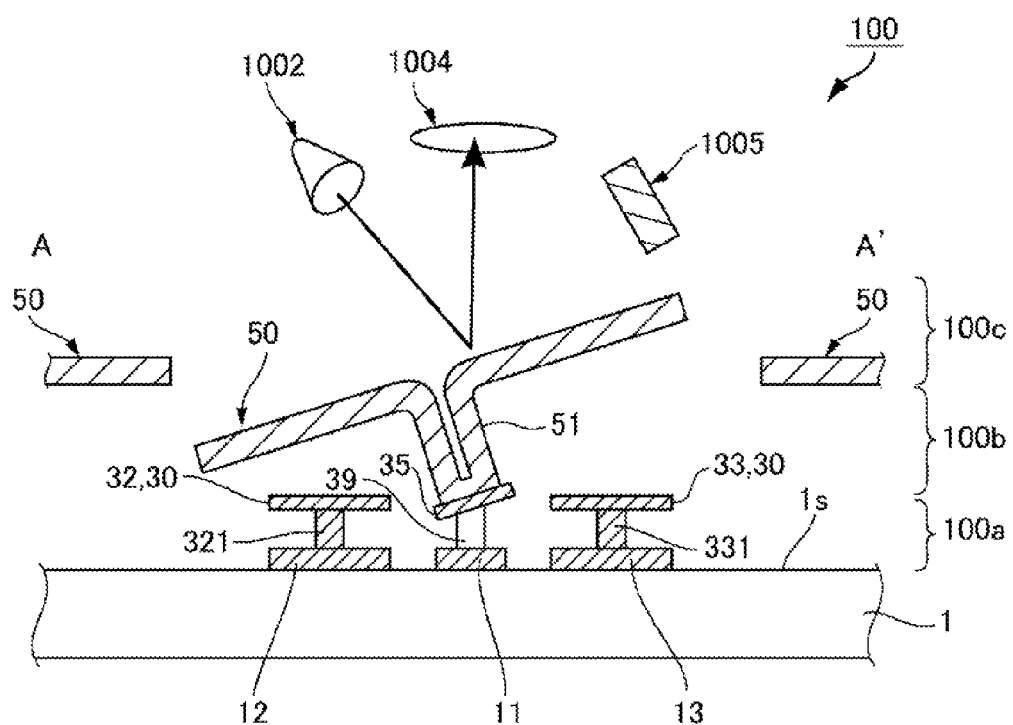
FIGS. 3A and 3B are explanatory views schematically illustrating a cross section along line A-A' in FIG. 2A of the main section of the electro-optical device to which the invention is applied.
Figure 3B:
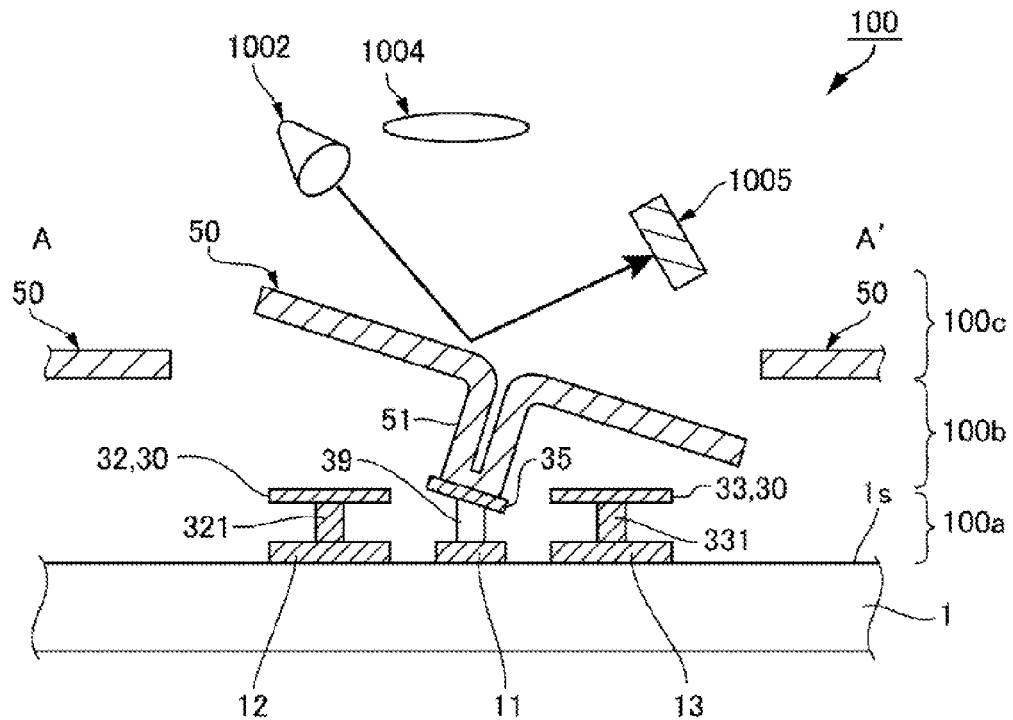

FIGS. 2A and 2B are explanatory views schematically illustrating a basic configuration of the electro-optical device 100 to which the invention is applied, FIG. 2A is an explanatory view illustrating a main section of the electro-optical device 100, and FIG. 2B is an exploded perspective diagram of the main section of the electro-optical device 100. FIGS. 3A and 3B are explanatory views schematically illustrating a cross section along line A-A' in FIG. 2A of the main section of the electro-optical device 100 to which the invention is applied, FIG. 3A is an explanatory view schematically illustrating a state in which a mirror is tilted to one side, and FIG. 3B is an explanatory view schematically illustrating a state in which the mirror is tilted to another side.

As shown in FIGS. 2A to 3B, in the electro-optical device 100, a plurality of mirrors 50 are disposed in a matrix form on one face 1s (first face) side of an element substrate 1, and the mirrors 50 are separated from the element substrate 1. For example, the element substrate 1 is a silicon substrate. For example, the mirror 50 is a micro-mirror in which one side length has a planar size of, for example, 10 to 30 μm. For example, the mirror 50 is disposed with an array from 800×600 to 1028×1024, and one mirror 50 corresponds to one pixel of an image.

A front face of the mirror 50 is an opposite face formed of a reflective metallic film of aluminum or the like. The electro-optical device 100 is provided with a first level portion 100a which includes a substrate side bias electrode 11, substrate side address electrodes 12 and 13, and the like which are formed on the one face is of the element substrate 1, a second level portion 100b which includes elevated address electrodes 32 and 33, and a hinge 35, and a third level portion 100c which includes the mirror 50. On the first level portion 100a, an address designating circuit 14 is formed on the element substrate 1. The address designating circuit 14 is provided with a wire 15 or the like of a memory cell, a word line, or a bit line for selectively controlling the operation of each mirror 50, and has a circuit configuration which is similar to a random access memory (RAM) which is provided with a CMOS circuit 16.

The second level portion 100b includes the elevated address electrodes 32 and 33, the hinge 35, and a mirror post 51. The elevated address electrodes 32 and 33 are supported by the substrate side address electrodes 12 and 13 while conducting to the substrate side address electrodes 12 and 13 via electrode posts 321 and 331. Hinge arms 36 and 37 extend from both sides of the hinge 35. The hinge arms 36 and 37 are supported by the substrate side bias electrode 11 while conducting to the substrate side bias electrode 11 via an arm post 39. The mirror 50 is supported by the hinge 35 while conducting to the hinge 35 via a mirror post 51. Accordingly, the mirror 50 conducts to the substrate side bias electrode 11 via the mirror post 51, the hinge 35, the hinge arms 36 and 37, and the arm post 39, and a bias voltage is applied from the substrate side bias electrode 11.

Here, stoppers 361, 362, 371, and 372 which prevent contact between the mirror 50 and the elevated address electrodes 32 and 33 are formed to abut with the leading ends of the hinge arms 36 and 37 when the mirror 50 is tilted.

The elevated address electrodes 32 and 33 configure a driving element 30 which drives such that the mirror 50 is tilted by generating electrostatic force with the mirror 50. In addition, there are cases where the substrate side address electrodes 12 and 13 are also configured so as to drive such that the mirror 50 is tilted due to electrostatic force being generated with the mirror 50, in this case, the driving element 30 is configured by the elevated address electrodes 32 and 33 and the substrate side address electrodes 12 and 13. As shown in FIGS. 3A and 3B, in the hinge 35, a driving voltage is applied to the elevated address electrodes 32 and 33, the hinge 35 twists when the mirror 50 is tilted so as to be pulled toward the elevated address electrode 32 or the elevated address electrode 33, and a return force is exhibited in a posture of the mirror 50 parallel to the element substrate 1 when suction force is eliminated with respect to the mirror 50 by stopping application of the driving voltage with respect to the elevated address electrodes 32 and 33.

As shown in FIG. 3A, for example, in the electro-optical device 100, the mirror 50 tilts to the elevated address electrode 32 side at one side, and an ON state is reached in which light which is emitted from the light source section 1002 is reflected toward the projection optical system 1004 by the mirror 50. In contrast to this, as shown in FIG. 3B, the mirror 50 tilts to the elevated address electrode 33 side on the other side, and an OFF state is reached in which light which is emitted from the light source section 1002 is reflected toward a light absorbing device 1005 by the mirror 50, and in the OFF state, the light is not reflected toward the projection optical system 1004. The driving is performed for each of the plurality of mirrors 50, and as a result, the light which is emitted from the light source section 1002 is modulated to image light using the plurality of mirrors 50 and projected from the projection optical system 1004, and an image is displayed.

Here, a yoke with a flat plate form which faces the substrate side address electrodes 12 and 13 is integrally provided with the hinge 35, electrostatic force which is generated between the elevated address electrodes 32 and 33 and the mirror 50 is applied, and the mirror 50 is driven by also using electrostatic force which acts between the substrate side address electrodes 12 and 13 and the yoke.

Sealing Structure of Electro-Optical Device 100

Figure 4A:
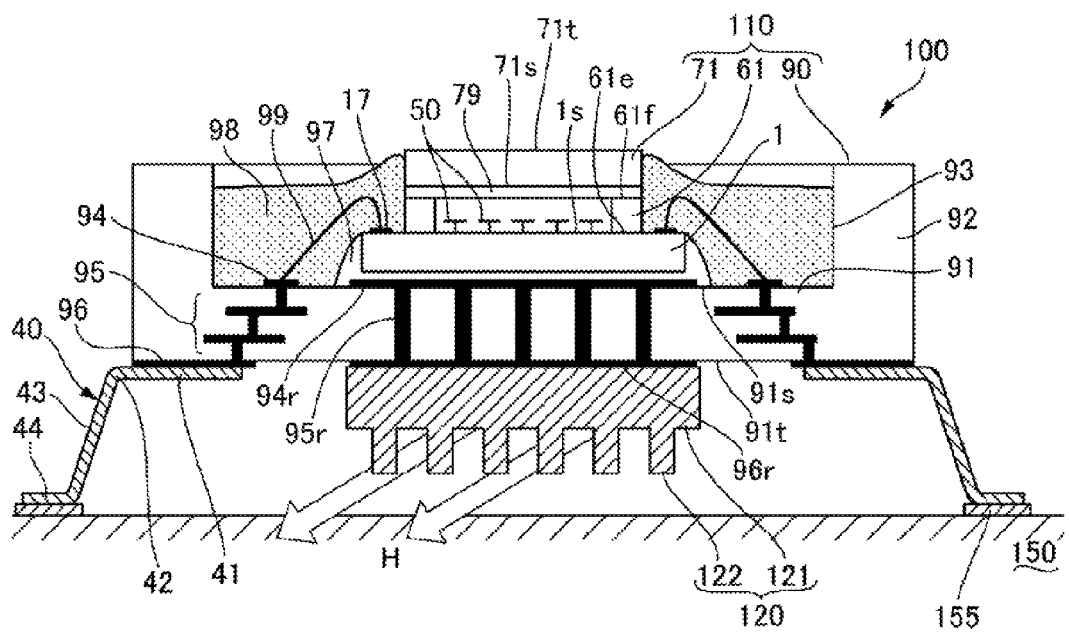
FIGS. 4A to 4C are explanatory diagrams of an electro-optical device according to Embodiment 1 of the invention.
Figure 4B:
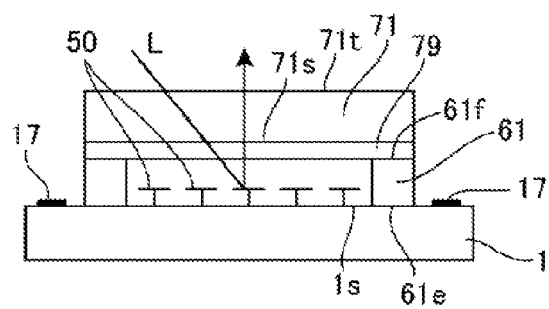
Figure 4C:
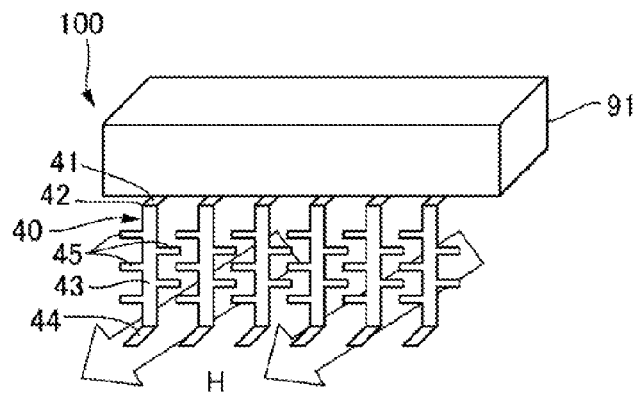

FIGS. 4A to 4C are explanatory diagrams of the electro-optical device 100 according to Embodiment 1 of the invention, FIG. 4A is a sectional view of the entire electro-optical device 100, FIG. 4B is a sectional view illustrating an enlarged periphery of the mirror 50, and FIG. 4C is an explanatory view of the lead terminal.

As shown in FIGS. 4A and 4B, in the electro-optical device 100 of the embodiment, at least a portion (for example, a portion on which the mirror 50 is formed) of one face is on which the mirror 50 is formed (first face) of the element substrate 1 on which a plurality of the mirrors 50 are formed that are described with reference to FIGS. 2A to 3B is sealed by a sealing member 110 which includes a frame shaped spacer 61 and a flat plate form light-transmitting cover 71 which has translucency. In addition, the electro-optical device 100 is provided with a substrate 90 which is formed of ceramic and the like as the sealing member 110, and the element substrate 1 is fixed to a concave form substrate mounting section 93 of the substrate 90, and then is sealed by a sealing resin 98. On the substrate 90, the substrate mounting section 93 is a bottomed concave section which is enclosed by a side plate section 92, and the element substrate 1 is fixed using an adhesive 97 on a bottom plate section 91 of the mounting substrate 90. In the embodiment, an aluminum nitride substrate with high thermal conductivity is used as the substrate 90. A metal-based adhesive such as silver paste or the like with high thermal conductivity is used as the adhesive 97.

Here, the end section 61e on the element substrate 1 side of the spacer 61 is adhered to the one face 1s of the element substrate 1. In addition, the spacer 61 is formed so as to surround the region in which the mirror 50 is formed in planar view (for example, in planar view when viewed from the one face 1s side of the element substrate 1). The light-transmitting cover 71 is supported on an end section Elf and is adhered to the end section 61f on the opposite side to the element substrate 1 of the spacer 61 via an infrared cut filter 79 which will be described later. In other words, the spacer 61 is positioned between the element substrate 1 and the light-transmitting cover 71. In this state, the light-transmitting cover 71 faces the front face of the mirror 50 at a position at an interval of a predetermined distance from the mirror 50. In other words, the sealing member 110 is provided such that the mirror 50 is positioned between the light-transmitting cover 71 and the element substrate 1. Accordingly, as indicated by an arrow L in FIG. 43, light passes through the light-transmitting cover 71 and is incident onto the mirror 50, then the light which is reflected using the mirror 50 passes through the light-transmitting cover 71 and is emitted. In the embodiment, the light-transmitting cover 71 is made of glass. The spacer 61 may be made of any one of glass, silicon, metal, ceramic, or resin, and in the embodiment, a glass substrate or a silicon substrate is used as the spacer 61.

On the one face 1s of the element substrate 1, a plurality of terminals 17 are formed on end sections which do not overlap with the mirror 50 in planar view (further outside than the spacer 61). In the embodiment, the terminals 17 are disposed in two rows so as to interpose the mirror 50. A portion of the plurality of terminals 17 are electrically connected to the elevated address electrodes 32 and 33 (driving element 30) via the address designating circuit 14 and the substrate side address electrodes 12 and 13 which are described with reference to FIGS. 2A to 3B. Another portion of the plurality of terminals 17 are electrically connected to the mirror 50 via the address designating circuit 14, the substrate side bias electrode 11, and the hinge 35 which are described with reference to FIGS. 2A to 3B. Yet another portion of the plurality of terminals 17 are electrically connected to a driving circuit or the like which is provided at the front of the address designating circuit 14 which is described with reference to FIGS. 2A to 3B.

Here, the terminal 17 is electrically connected by a wire 99 for wiring bonding to an internal metal layer 94 which is formed on an inner face 91s on the element substrate 1 side of the bottom plate section 91 of the mounting substrate 90 since the opposite side from the element substrate 1 is in an open state. The bottom plate section 91 of the substrate 90 is a multi-layer substrate, the internal metal layer 94 conducts with an external metal layer 96 which is formed on an outer face 91t on a side opposite from the element substrate 1 of the bottom plate section 91 via a multi-layer section 95 which is formed of a through hole and a wire that are formed on the bottom plate section 91.

The sealing resin 98 is provided inside (in a concave section) of the side plate section 92 of the substrate 90. The sealing resin 98 covers the side face of the light-transmitting cover 71 from the middle in a thickness direction while covering around the element substrate 1 and around the spacer 61.

Temperature Increase Measure 1

In the electro-optical device 100 configured in such a manner, there is a temperature increase of the light-transmitting cover 71 and the element substrate 1 caused by light which is irradiated toward the mirror 50. Here, in the embodiment, the infrared cut filter 79 is provided with respect to the light-transmitting cover 71. In the embodiment, the infrared cut filter 79 forms a film such as a dielectric multilayer film which is laminated with respect to the light-transmitting cover 71. In the infrared cut filter 79, reflectance with respect to visible light is extremely small with respect to a reduction in an amount of permeation of infrared rays by reflection of light of an infrared region.

Here, the infrared cut filter 79 is laminated on at least one of a face 71s (second face) facing the mirror 50 of the light-transmitting cover 71, and a face 71t (third face) opposite from the face 71s facing the mirror 50 of the light-transmitting cover 71. In the embodiment, the infrared cut filter 79 is laminated on the entire body of the face 71s on the mirror 50 side of the light-transmitting cover 71. For this reason, the spacer 61 is adhered to the light-transmitting cover 71 via the infrared cut filter 79.

According to the configuration, when a light which is irradiated toward the mirror 50 passes through the light-transmitting cover 71, the entirety or a great amount of a light component in the infrared region caused by heat generation is removed by the infrared cut filter 79. Accordingly, even if a portion of the irradiated light reaches the one face is of the element substrate 1, the light component of the infrared region is either not included in light which reaches the element substrate 1 or is slightly included. In addition, when the light which is irradiated toward the mirror 50 passes through the light-transmitting cover 71, although the light component of the infrared region in light passing through is included, the light component of the infrared region is either not included in light which is reflected by the mirror 50 and passes through the light-transmitting cover 71 or is slightly included. Accordingly, in the light-transmitting cover 71 and the element substrate 1, since it is difficult for an increase in temperature to be generated, it is possible to suppress malfunctions and a reduction in life of the electro-optical device 100 which is caused by an increase in temperature of the element substrate 1 and the like.

Temperature Increase Measure 2

In the electro-optical device 100 of the embodiment, a plurality of lead terminals 40 which conduct to the external metal layer 96 of the substrate 90 extend from the substrate 90 toward the outside, and the lead terminal 40 has a bent section 42 that is bent in a direction in which a second connecting section 44 of the lead terminal 40 is away from the substrate 90. In further detail, the lead terminal 40 has a first connecting section 41 which is connected to the external metal layer 96 of the substrate 90, an intermediate section 43 which extends obliquely from the end section of the first connecting section 41 due to the bent section 42, and a second connecting section 44 which is formed of a leading end section that is parallel to the first connecting section 41 by being bent to the outside at an end section of the intermediate section 43. Accordingly, when the second connecting section 44 (leading end section) of the lead terminal 40 is connected to an electrode 155 of a circuit board 150 which is provided in the projection-type display apparatus 1000 which is illustrated in FIG. 1 using solder or the like, a space is interposed between the substrate 90 and the circuit board 150 since the substrate 90 is in a state of being separated from the circuit board 150. Accordingly, it is possible to increase heat dissipation from the electro-optical device 100 bypassing a fluid body such as air, which is indicated by arrow H, between the substrate 90 and the circuit board 150. Accordingly, it is difficult for temperature to increase in the element substrate 1 or the like. Therefore, it is possible to suppress malfunctions and a reduction in life of the electro-optical device 100 which is caused by an increase in temperature of the element substrate 1 or the like.

In addition, the plurality of lead terminals 40 are respectively provided with a plurality of fin-shape convex sections 45 which protrude in a direction which intersects from the intermediate section 43 between the bent section 42 and the second connecting section 44 with respect to an extension direction of the lead terminal 40. In the embodiment, the plurality of fin-shape convex sections 45 are provided on both sides in the direction which intersects with the extension direction of the lead terminal 40. For this reason, when the fluid body such as air which is indicated using the arrow H passes between the lead terminals 40, heat dissipation from the lead terminal 40 is performed with good efficiency. Accordingly, it is possible to suppress malfunctions and a reduction in life of the electro-optical device 100 which is caused by an increase in temperature of the element substrate 1 or the like.

Temperature Increase Measure 3

In the electro-optical device 100 of the embodiment, a heat dissipation unit 120 is attached to the outer face 91t opposite from the element substrate 1 of the bottom plate section 91 of the substrate 90. In the embodiment, the heat dissipation unit 120 is a heat sink in which a plurality of heat dissipation fins 122 protrude from a block 121 to the opposite side from the substrate 90, and the heat sink is made from metal such as aluminum or copper.

In the embodiment, a heat dissipation external metal layer 96r is formed on the outer face 91t of the bottom plate section 91 of the substrate 90, and the block 121 of the heat dissipation unit 120 (heat sink) is fixed to the heat dissipation external metal layer 96r using solder or the like. Here, a heat dissipation internal metal layer 94r is formed on the inner face 91s of the element substrate 1 side of the bottom plate section 91 of the substrate 90, and the heat dissipation internal metal layer 94r and the heat dissipation external metal layer 96r are connected using a heat dissipation relay metal section 95r which is formed inside a through hole. For this reason, heat of the element substrate 1 is transmitted with good efficiency to the heat dissipation unit 120 via the heat dissipation internal metal layer 94r, the heat dissipation relay metal section 95r, and the heat dissipation external metal layer 96r. In addition, the fluid body such as air which passes between the substrate 90 and the circuit board 150 passes within a heat dissipation fin 122 as indicated by an arrow H. Accordingly, it is possible to suppress malfunctions and a reduction in life of the electro-optical device 100 which is caused by an increase in temperature of the element substrate 1 or the like, since the heat of the element substrate 1 escapes with good efficiency from the heat dissipation unit 120.

Manufacturing Method of Electro-Optical Device 100

Figure 8A:
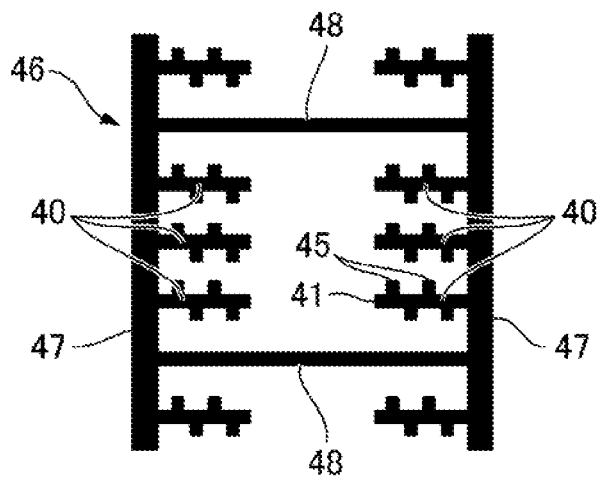
FIGS. 8A to 8C are explanatory views of a lead frame which is used in the manufacturing process of the electro-optical device according to Embodiment 1 of the invention.
Figure 8B:
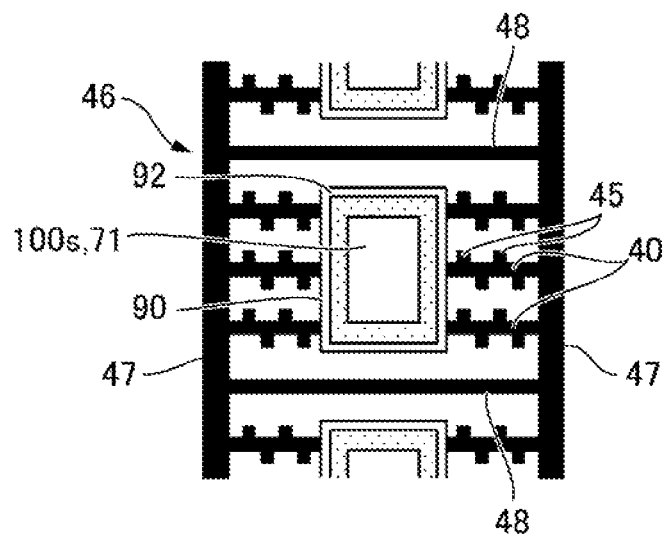
Figure 8C:
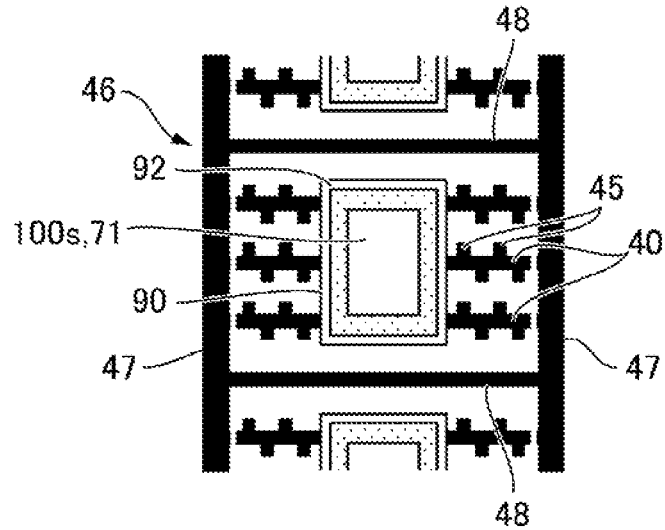
Figure 9A:
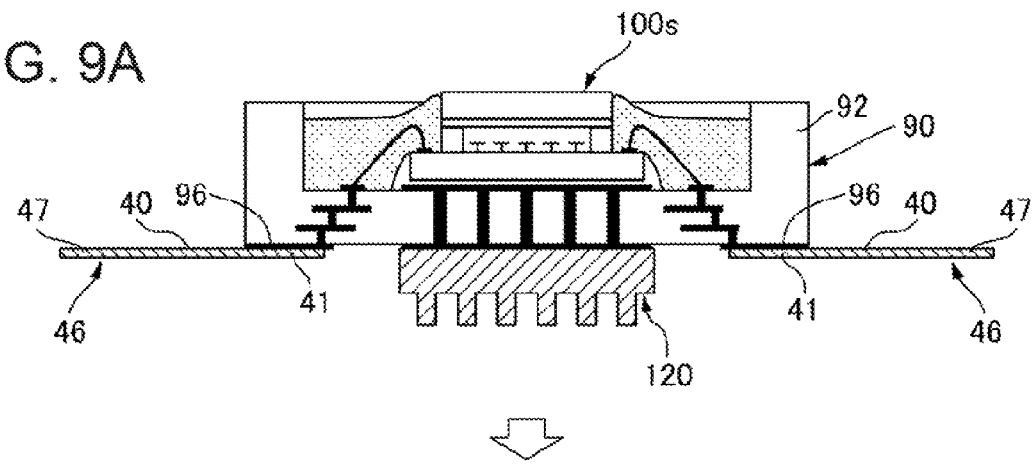
FIGS. 9A to 9C are process sectional views illustrating a method for forming a lead terminal in the manufacturing process of the electro-optical device according to Embodiment 1 of the invention.
Figure 9B:
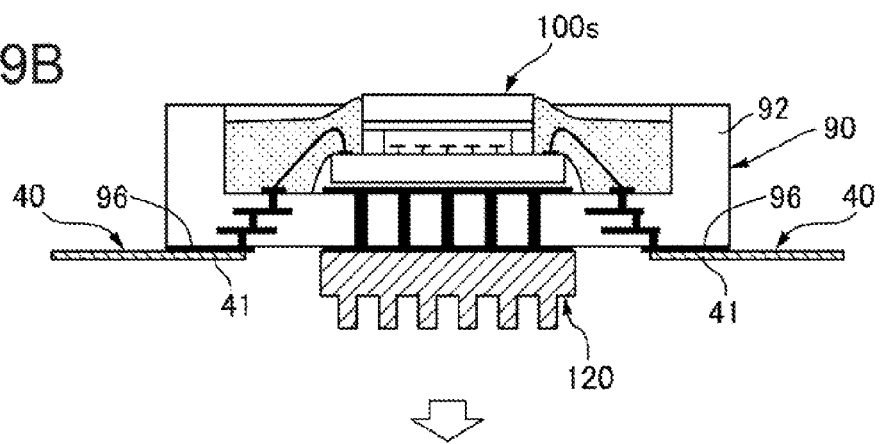
Figure 9C:
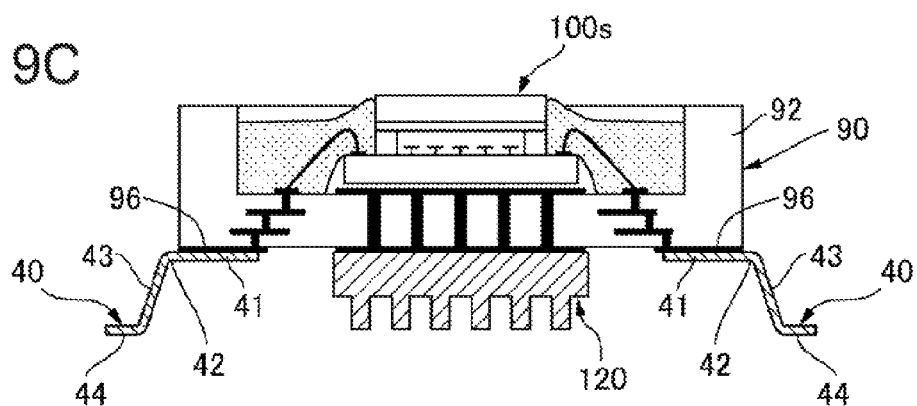

The manufacturing method of the electro-optical device 100 of the embodiment will be described with reference to FIGS. 5A to 9C. FIGS. 5A to 5D are process sectional views illustrating a method for obtaining a plurality of laminated bodies with a single item size from a large wafer out of a manufacturing process of the electro-optical device 100 according to Embodiment 1 of the invention. FIGS. 6A to 6F are process diagrams illustrating a manufacturing method of the second wafer 20 or the like which is used in manufacture of the electro-optical device 100 according to Embodiment 1 of the invention, and FIGS. 6A to 6F illustrate cut end surface views on a lower level in planar view while illustrating planar views of a wafer in each process. FIGS. 7A to 7E are process sectional views illustrating a sealing process of the element substrate 1 using the substrate 90 and the sealing resin 98 in the manufacturing process of the electro-optical device 100 according to Embodiment 1 of the invention. FIGS. 8A to 8C are explanatory views of a lead frame of the like which is used in the manufacturing process or the electro-optical device 100 according to Embodiment 1 of the invention. FIGS. 9A to 9C are process sectional views illustrating a method for forming the lead terminal 40 in the manufacturing process of the electro-optical device 100 according to Embodiment 1 of the invention. Here, FIG. 6B omits illustration of the mirror and the like, and FIGS. 5A to 5D illustrate the number of mirrors 50 being reduced in comparison to in FIGS. 4A to 4C, and three mirrors 50 being formed on one element substrate 1.

Figure 5A:
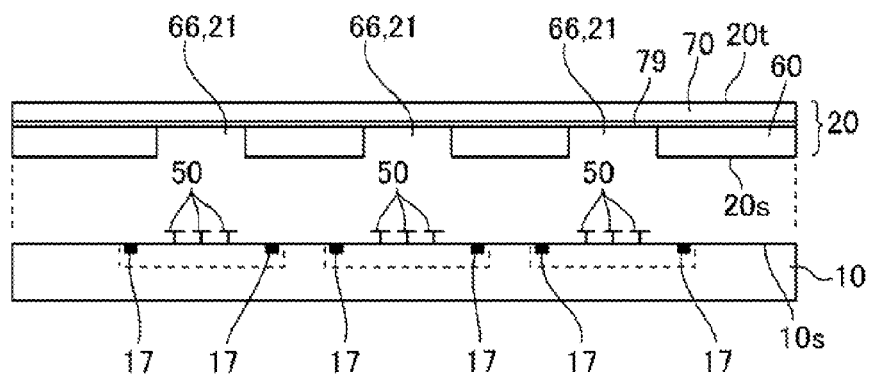
FIGS. 5A to 5D are process sectional views illustrating a method for obtaining a plurality of laminated bodies with a single item size from a large wafer out of a manufacturing process of the electro-optical device according to Embodiment 1 of the invention.
Figure 5B:
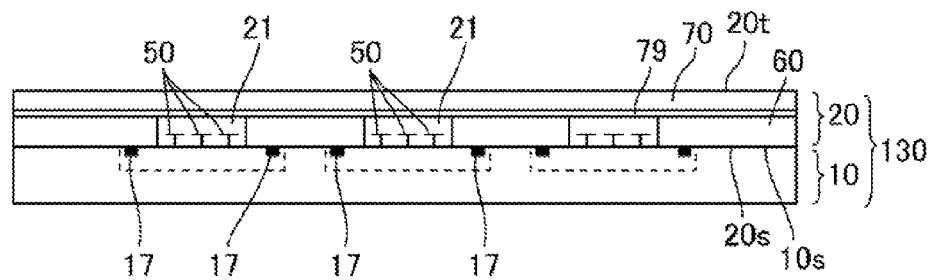
Figure 6C:
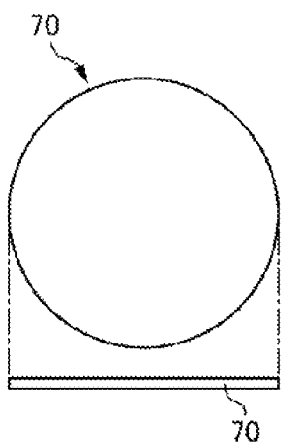
FIGS. 6A to 6F are process diagrams illustrating a manufacturing method of a second wafer or the like which is used in manufacture of the electro-optical device according to Embodiment 1 of the invention.
Figure 6A:
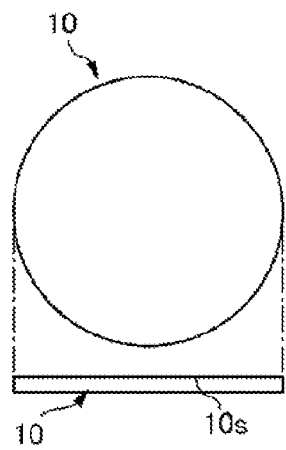
Figure 6D:
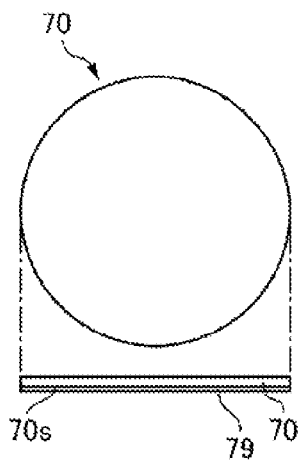
Figure 6E:
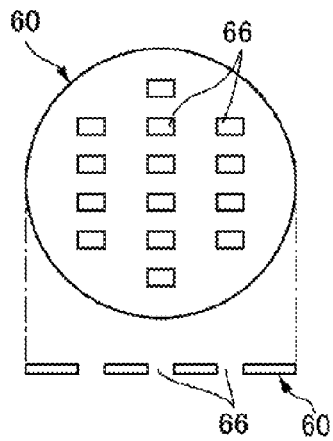
Figure 6B:
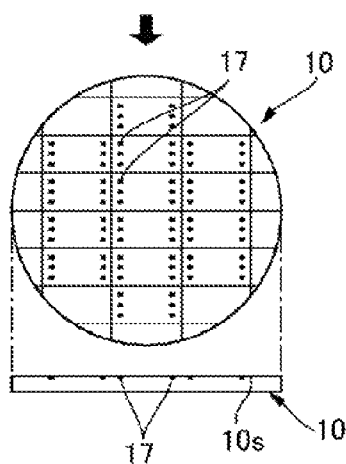

As shown in FIGS. 5A and 6B, in the manufacture of the electro-optical device 100 of the embodiment, in the first wafer preparation process, the first wafer 10 on which the terminal 17 is formed that is electrically connected to the driving element 30 (refer to FIGS. 2A to 3B) which drives the mirror 50 is prepared at a position adjacent to the mirror 50 in planar view (for example, in planar view when viewed from the one face 10s side of the first wafer 10), while the mirror 50 is formed in each region in which the element substrate 1 is split on the one face 10s (first face) of a large first wafer 10 which is able to take a large number of the element substrates 1. For example, as shown in FIGS. 5A, 6A, and 6B, the first wafer 10 may be prepared by forming the driving element 30 (refer to FIGS. 2A to 3B) that drives the mirror 50 and the terminal 17 at a position which is adjacent to the mirror 50 in planar view, while the mirror 50 is formed in each region in which the element substrate 1 is split on the one face 10s of the large first wafer 10 which is able to take a large number of the element substrates 1.

In addition, as shown in FIG. 5A, in the second wafer forming process, a large second wafer 20 is prepared which is able to take a large number of the spacers 61 and the light-transmitting covers 71. The infrared cut filter 79 is provided on the entire face which includes a region which overlaps with the concave section 21 while the concave section 21 in which the bottom section has translucency is formed on the second wafer 20. Here, it is sufficient if the infrared cut filter 79 is formed in at least the region which overlaps with the concave section 21.

In the forming of the second wafer 20, in the second wafer forming process, for example, the processes which are illustrated in FIGS. 6C to 6F are performed. First, as shown in FIG. 6C, the light-transmitting wafer 70 which has translucency and is able to take a large number of light-transmitting covers 71 is prepared, then in a first process which is illustrated in FIG. 6D, the infrared cut filter 79 which is formed of a dielectric multilayer film or the like that is formed on the one face 70s of the light-transmitting wafer 70. The light-transmitting wafer 70 is made of glass. In addition, as shown in FIG. 6E, the spacer wafer 60 which is able to take a large number of spacers 61 is prepared, and then in a second process, a through hole 66 for configuring the concave section 21 is formed on the spacer wafer 60 by a process such as etching. The spacer wafer 60 may be made of any one of glass, silicon, metal, or resin, and in the embodiment, the spacer wafer 60 is made of glass or silicon.

Figure 6F:
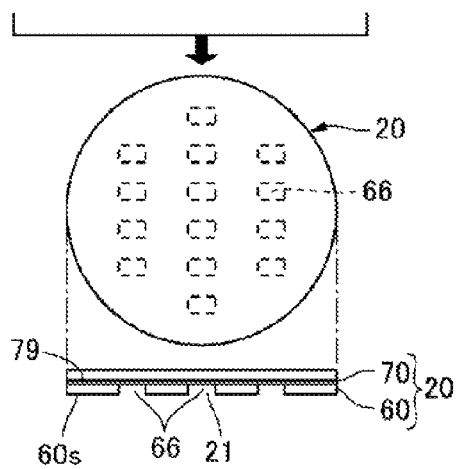

Next, as shown in FIG. 6F, in a third process, the spacer wafer 60 is adhered by overlapping with the face 70s side of the light-transmitting wafer 70 (side on which the infrared cut filter 79 is formed). As a result, the second wafer 20 on which the spacer wafer 60 and the light-transmitting wafer 70 are laminated is formed, on the second wafer 20, a fourth face 20s of the second wafer 20 which is provided with the concave section 21 is configured using the face 60s of the spacer wafer 60, and a fifth face 20t of the second wafer 20 is configured using a face opposite from the spacer wafer 60 of the light-transmitting wafer 70 (or alternatively, a face opposite from the fourth face 20s). In addition, one opening end of the through hole 66 is closed by the infrared cut filter 79 and the light-transmitting wafer 70, and the bottom section is the light-transmitting concave section 21.

Next, as shown in FIG. 53, in the adhering process, the one face 10s of the first wafer 10 and the fourth face 20s of the second wafer 20 are adhered such that the concave section 21 overlaps with the mirror 50 in planar view.

Figure 5C:
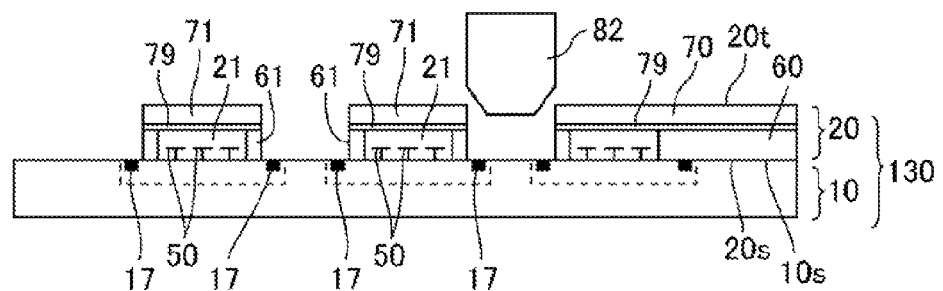
Figure 5D:
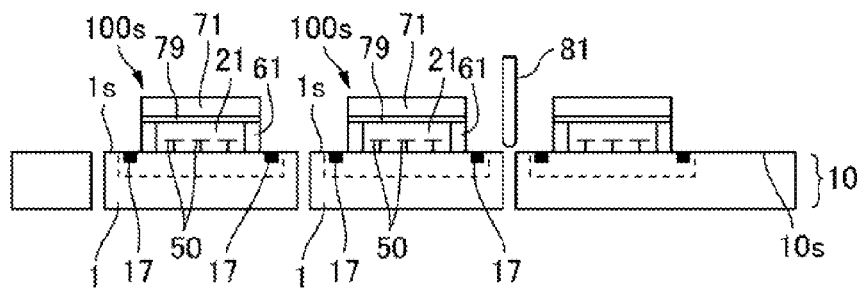

Next, in the splitting process shown in FIGS. 5C and 5D, a laminated body 100s is obtained with a single item size which is provided with the light-transmitting cover 71 which faces the mirror 50 and the element substrate 1 which is provided with the mirror 50 and the terminal 17 by a laminated body 130 being split into the first wafer 10 and the second wafer 20. In the splitting process, first, in the second wafer dicing process shown in FIG. 5C, the second wafer 20 is diced by causing a second wafer dicing blade 82 to enter from the fifth face 20t of the second wafer 20. As a result, the second wafer 20 is split, out of the second wafer 20, the light-transmitting cover 71 is configured using a flat plate portion which is split from the light-transmitting wafer 70, and the spacer 61 is configured by a frame portion which is split from the spacer wafer 60. Next, in the first wafer dicing process which is illustrated in FIG. 5D, dicing is carried out on the first wafer 10 by causing a first wafer dicing blade to enter a cutting location (between the adjacent light-transmitting covers 71 and between the adjacent spacers 61) of the second wafer 20 from the second wafer 20 side with respect to the first wafer 10. As a result, a plurality of laminated bodies 100s are manufactured on which the one face 1s of the element substrate 1 on which a plurality of the mirrors are formed is sealed by the spacer 61 and the light-transmitting cover 71. Here, in the embodiment, a circular shape wafer is used, but a planar shape, a rectangular shape, and the like may be used.

With respect to the laminated body 100s which is obtained using the above process, a process which is illustrated in FIGS. 7A to 7E is performed in performing sealing using the substrate 90 and the sealing resin 98 which is illustrated in FIGS. 4A to 40.

Figure 7A:
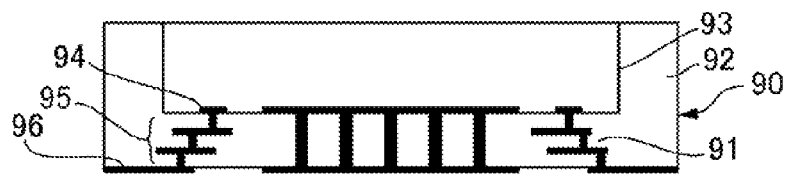
FIGS. 7A to 7E are process sectional views illustrating a process in which an element substrate is sealed using a substrate and a sealing resin in the manufacturing process of the electro-optical device according to Embodiment 1 of the invention.
Figure 7B:
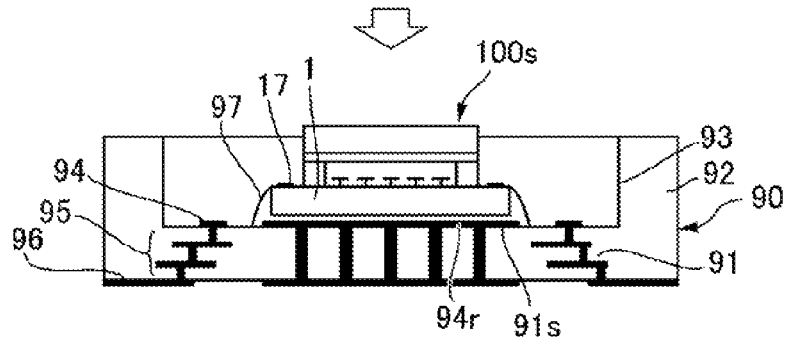
Figure 7C:
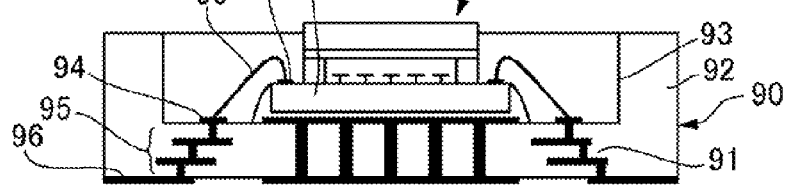
Figure 7D:
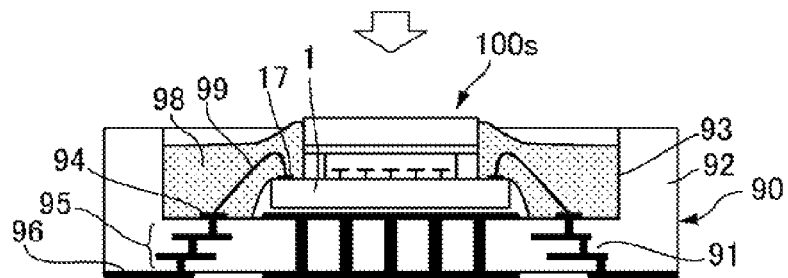

As shown in FIG. 7A, first, the substrate 90 that becomes a concave section which is surrounded by the substrate mounting section 93 in the side plate section 92 is prepared, then, as shown in FIG. 7B, the element substrate 1 of the laminated body 100s is fixed to the heat dissipation internal metal layer 94r on which the bottom section of the substrate mounting section 93 (the inner face 91s of the bottom plate section 91) using the adhesive 97. Next, as shown in FIG. 7C, the terminal 17 of the element substrate 1 and the internal metal layer 94 of the substrate 90 are electrically connected by the wire 99 for wiring bonding. Next, as shown in FIG. 7D, the sealing resin 98 is injected inside the side plate section 92 of the substrate 90 prior to curing, then the sealing resin 98 is cured, and the element substrate 1 is sealed using the sealing resin 98. As a result, it is possible to obtain the electro-optical device 100 on which the element substrate 1 is sealed using the spacer 61, the light-transmitting cover 71, the substrate 90, and the sealing resin 98.

Figure 7E:
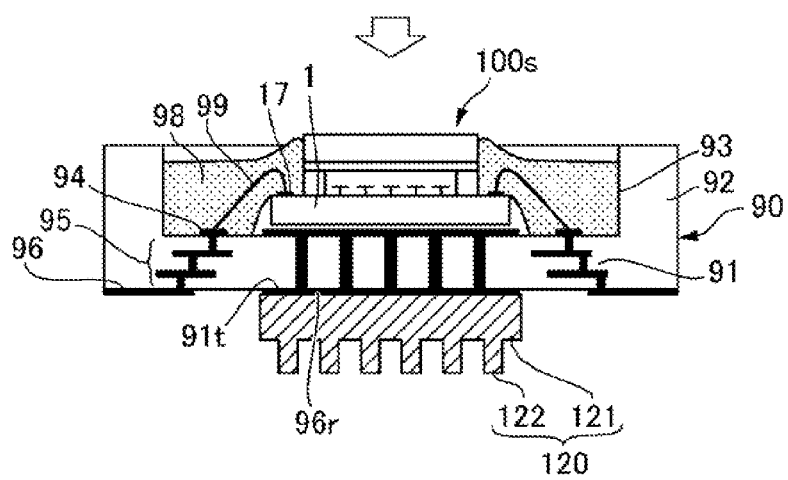

In addition, in the electro-optical device 100 of the embodiment, in a heat dissipation unit attachment process which is illustrated in FIG. 7E, the block 121 of the heat dissipation unit 120 is fixed to the heat dissipation external metal layer 96r which is provided on the outer face 91t of the bottom plate section 91 of the substrate 90 using solder or the like.

Furthermore, in the electro-optical device 100 of the embodiment, a lead frame 46 is used which is illustrated in FIG. 8A, in the process illustrated in FIGS. 9A to 9C, the lead terminal 40 which is described with reference to FIGS. 4A to 4C is attached to the substrate 90. A lead frame 46 which is shown in FIG. 8A is connected to two linking sections 47 which extend parallel to each other using a linking section 48. In addition, in the two linking sections 47, the lead terminal 40 extends from the other side toward one side while the lead terminal 40 extends from the one side toward the other side.

Accordingly, in the embodiment, as shown in FIGS. 8B and 9A, the substrate 90 which the laminated body 100s seals is disposed between the two linking sections 47, and the first connecting section 41 forming an end section of the lead terminal 40 and the external metal layer 96 of the substrate 90 are connected using solder or the like.

Next, as shown in FIGS. 8C and 9B, a root portion of the lead terminal 40 of the lead frame 46 is cut, and the lead terminal 40 and the linking section 47 are separated.

Next, as shown in FIG. 9C, the bent section 42 is formed by performing a bending process in the lead terminal 40, and the second connecting section 44 (leading end section) is away from the substrate 90 in an oblique direction. As a result, the electro-optical device 100 which is illustrated in FIGS. 4A to 4C is completed.

Embodiment 2

Figure 10:
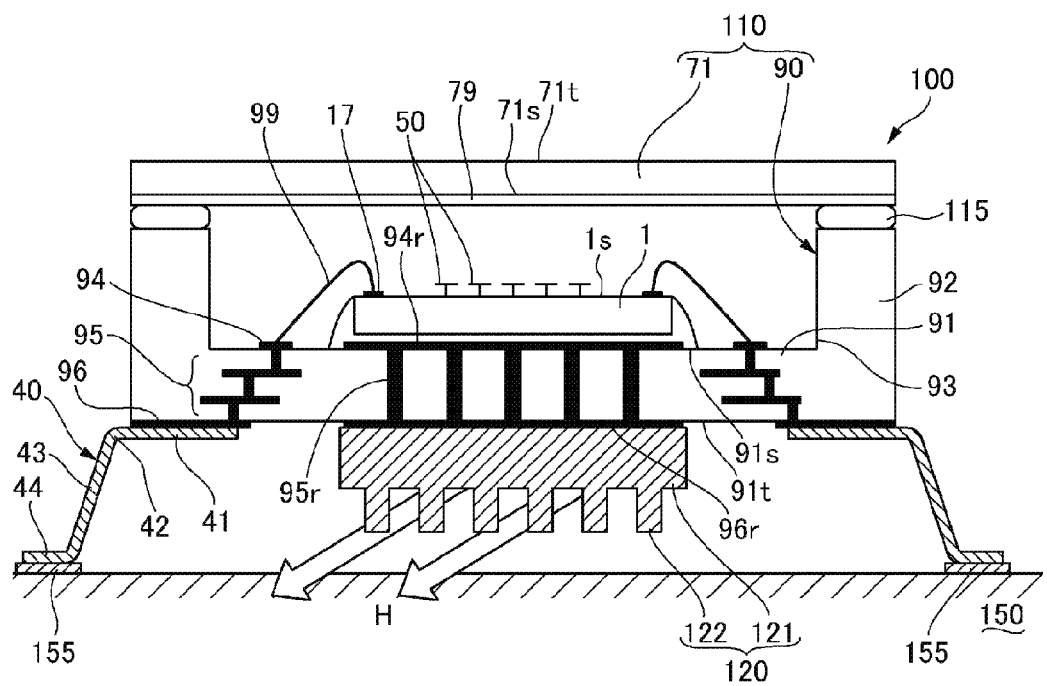
FIG. 10 is an explanatory view of an electro-optical device according to Embodiment 2 of the invention.
Figure 11:
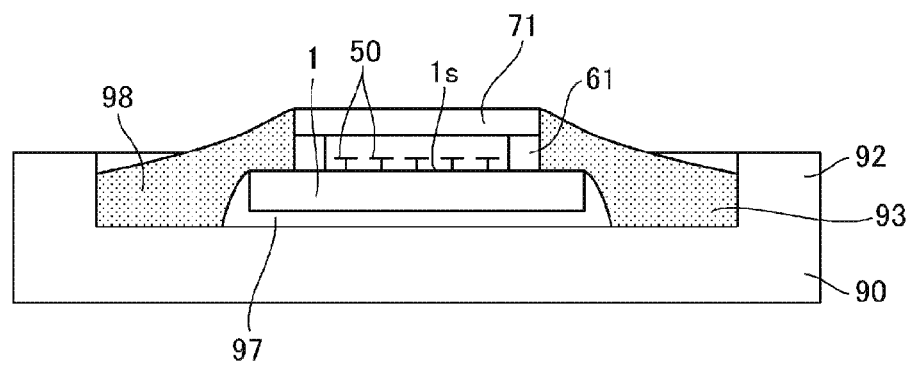
FIG. 11 is an explanatory view of an electro-optical device according to a reference example of the invention.

FIG. 10 is a sectional view of the electro-optical device 100 according to Embodiment 2 of the invention. Here, since the basic configuration of the embodiment is the same as in Embodiment 1, common portions are given the same reference numerals and description thereof is omitted.

As shown in FIG. 10, the electro-optical device 100 of the embodiment is the same as in Embodiment 1, and has the element substrate 1 on which the mirror 50 and the terminal 17 are formed and the sealing member 110 which seals the element substrate 1. In addition, the sealing member 110 includes the light-transmitting cover 71 which faces the mirror 50 from the opposite side from the element substrate 1, and the substrate 90 on which the concave shaped substrate mounting section 93 is provided inside which the element substrate 1 is disposed. However, in the embodiment, the spacer 61 and the sealing resin 98 which are described with reference to FIGS. 4A to 4C and the like are not used. For this reason, in the embodiment, the opening end of the substrate mounting section 93 on the substrate 90 is closed using the light-transmitting cover 71 which is fixed to the side plate section 92 of the substrate 90. Accordingly, it is possible to simplify the structure of the electro-optical device 100. In addition, in the embodiment, the side plate section 92 of the substrate 90 and the light-transmitting cover 71 are fixed using sealing glass 115. Accordingly, the reliability of the sealing portion of the side plate section 92 of the substrate 90 and the light-transmitting cover 71 is high.

In the electro-optical device 100 which is configured in this manner, the temperature increase measures 1, 2, and 3 which are described in Embodiment 1 are also adopted. In detail, the infrared cut filter 79 is laminated with at least one of the face 71s on the mirror 50 side of the light-transmitting cover 71, and the face 71t opposite from the mirror 50 of the light-transmitting cover 71. In the embodiment, the infrared cut filter 79 is laminated on the entire body of the face 71s on the mirror 50 side of the light-transmitting cover 71. In addition, in the electro-optical device 100, the lead terminal 40 which extends outside from the substrate 90 has the bent section 42 in which the second connecting section 44 of the lead terminal 40 is bent in a direction away from the substrate 90. For this reason, a space is free into which the fluid body such as air, indicated by the arrow H, passes between the substrate 90 and the circuit board 150. Furthermore, in the embodiment, the heat dissipation unit 120 (heat sink) is provided on the outer face 91t of the bottom plate section 91 of the substrate 90. Accordingly, since it is possible to suppress the temperature increase of the element substrate 1, it is possible to suppress malfunctions and a reduction in life of the electro-optical device 100 which is caused by the increase in temperature of the element substrate 1 and the like.

Other Embodiments

In the embodiments described above, the infrared cut filter 79 is laminated on the face 71s which faces the mirror 50 of the light-transmitting cover 71, but the infrared cut filter 79 may be laminated on the face 71t opposite from the mirror 50 of the light-transmitting cover 71. In addition, the infrared cut filter 79 may be laminated on both of the face 71s and the face 71t of the light-transmitting cover 71. In addition, in the embodiments described above, the infrared cut filter 79 is laminated on the light-transmitting cover 71, but the light-transmitting cover 71 and the infrared cut filter 79 may be disposed by overlapping by a gap being provided between the light-transmitting cover 71 and the infrared cut filter 79.

What is claimed is:

1. A method of manufacturing an electro-optical device, comprising:
   preparing a first wafer that is provided with a mirror, a driving element that drives the mirror, and a terminal;
   forming a translucent second wafer having a bottom section with a concave section provided thereon, the second wafer having an infrared cut filter that overlaps with the concave section;
   adhering a face of the first wafer on a side on which the mirror is provided to a face of the second wafer on which the concave section is provided such that the mirror and the concave section overlap in planar view; and
   splitting the first wafer and the second wafer.

2. The method of manufacturing an electro-optical device according to claim 1, wherein the forming of the second wafer includes:
   forming the infrared cut filter on a light-transmitting wafer;
   forming a through hole in a spacer wafer; and
   obtaining the second wafer by adhering the light-transmitting wafer with the spacer wafer so as to overlap each other.

* * * * *